United States Patent
Hu et al.

(10) Patent No.: US 9,536,573 B2
(45) Date of Patent: Jan. 3, 2017

(54) 3D MEMORY STRUCTURE AND METHOD FOR MANUFACTURING THE SAME

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/645,446

(22) Filed: Mar. 12, 2015

(65) Prior Publication Data

US 2016/0267947 A1  Sep. 15, 2016

(51) Int. Cl.
| | |
|---|---|
| H01L 29/49 | (2006.01) |
| G11C 5/06 | (2006.01) |
| G11C 8/10 | (2006.01) |
| H01L 23/528 | (2006.01) |
| H01L 21/768 | (2006.01) |
| H01L 27/115 | (2006.01) |

(52) U.S. Cl.
CPC ............... *G11C 5/063* (2013.01); *G11C 8/10* (2013.01); *H01L 21/768* (2013.01); *H01L 23/5283* (2013.01); *H01L 27/11548* (2013.01); *H01L 27/11575* (2013.01)

(58) Field of Classification Search
CPC ........... G11C 5/063; G11C 8/10; H01L 21/768
See application file for complete search history.

(56) References Cited

U.S. PATENT DOCUMENTS

| | | | | |
|---|---|---|---|---|
| 9,147,468 | B1* | 9/2015 | Lue .................... | G11C 11/5671 |
| 2010/0327323 | A1* | 12/2010 | Choi .................. | G11C 16/0483 257/202 |
| 2013/0087845 | A1* | 4/2013 | Yasuda ............. | H01L 21/28282 257/324 |
| 2014/0231954 | A1* | 8/2014 | Lue ................... | H01L 27/11524 257/528 |
| 2014/0264898 | A1* | 9/2014 | Hu ........................ | H01L 21/768 257/773 |
| 2015/0364196 | A1* | 12/2015 | Lin ........................ | G11C 16/08 365/185.11 |

* cited by examiner

*Primary Examiner* — Michael Shingleton
(74) *Attorney, Agent, or Firm* — McClure, Qualey & Rodack, LLP

(57) ABSTRACT

A 3D memory structure and a method for manufactured the same are provided. The 3D memory structure comprises a plurality of strings, a plurality of first conductive lines, a plurality of second conductive lines and a plurality of third conductive lines. The strings are disposed in parallel. The first conductive lines are disposed over the strings. Center regions of the first conductive lines are disposed perpendicular to the strings. The second conductive lines are disposed over the first conductive lines. The second conductive lines connect end regions of half of the first conductive lines. The third conductive lines are disposed over the second conductive lines. The third conductive lines connect end regions of the other half of the first conductive lines.

13 Claims, 5 Drawing Sheets

3D MEMORY STRUCTURE AND METHOD FOR MANUFACTURING THE SAME

TECHNICAL FIELD

This disclosure relates to a semiconductor structure and a method for manufacturing the same. More particularly, this disclosure relates to a 3D memory structure and a method for manufacturing the same.

BACKGROUND

In a typical 3D memory device, word lines are connected to the decoders disposed at the periphery region mainly by poly-silicon and silicide paths, which are not high-conductivity paths for signals. To improve the operational efficiency of the memory, it usually uses two X-decoders at two opposite sides of a memory array region. The two X-decoders accept the same signal and transfer the same signal to the array region simultaneously during the device operation. As such, the signal can be transferred through a shorter path, and the RC delay of word line signal is improved.

As the shrink of the size of memory devices, the two X-decoders method is harmful to the array efficiency. How to reduce the area of X-decodes by improving the RC delay of word line becomes important. One way is using metal word line process. However, this process is hard to be carried out especially for the vertical gate structure because of its process flow and yield control.

SUMMARY

In this disclosure, a 3D memory structure and a method for manufactured the same are provided. The area of one of the two X-decoders is released for the array efficiency.

According to some embodiments, a 3D memory structure comprises a plurality of strings, a plurality of first conductive lines, a plurality of second conductive lines and a plurality of third conductive lines. The strings are disposed in parallel. The first conductive lines are disposed over the strings. Center regions of the first conductive lines are disposed perpendicular to the strings. The second conductive lines are disposed over the first conductive lines. The second conductive lines connect end regions of half of the first conductive lines. The third conductive lines are disposed over the second conductive lines. The third conductive lines connect end regions of the other half of the first conductive lines.

According to some embodiments, a 3D memory structure comprises a plurality of strings, a plurality of first conductive lines, a first metal layer and a second metal layer. The strings are disposed in parallel. The first conductive lines are disposed over the strings. Center regions of the first conductive lines are disposed perpendicular to the strings. The first metal layer is disposed over the first conductive lines. The first metal layer comprises a plurality of second conductive lines connecting end regions of half of the first conductive lines. The second metal layer is disposed over the first metal layer. The second metal layer comprises a plurality of third conductive lines connecting end regions of the other half of the first conductive lines.

According to some embodiments, a method for manufacturing a 3D memory structure comprises the following steps. First, a plurality of strings are formed. The strings are disposed in parallel. A plurality of first conductive lines are formed over the strings. Center regions of the first conductive lines are formed perpendicular to the strings. Then, a plurality of second conductive lines are formed over the first conductive lines. The second conductive lines connect end regions of half of the first conductive lines. A plurality of third conductive lines are formed over the second conductive lines. The third conductive lines connect end regions of the other half of the first conductive lines.

Figure 1:
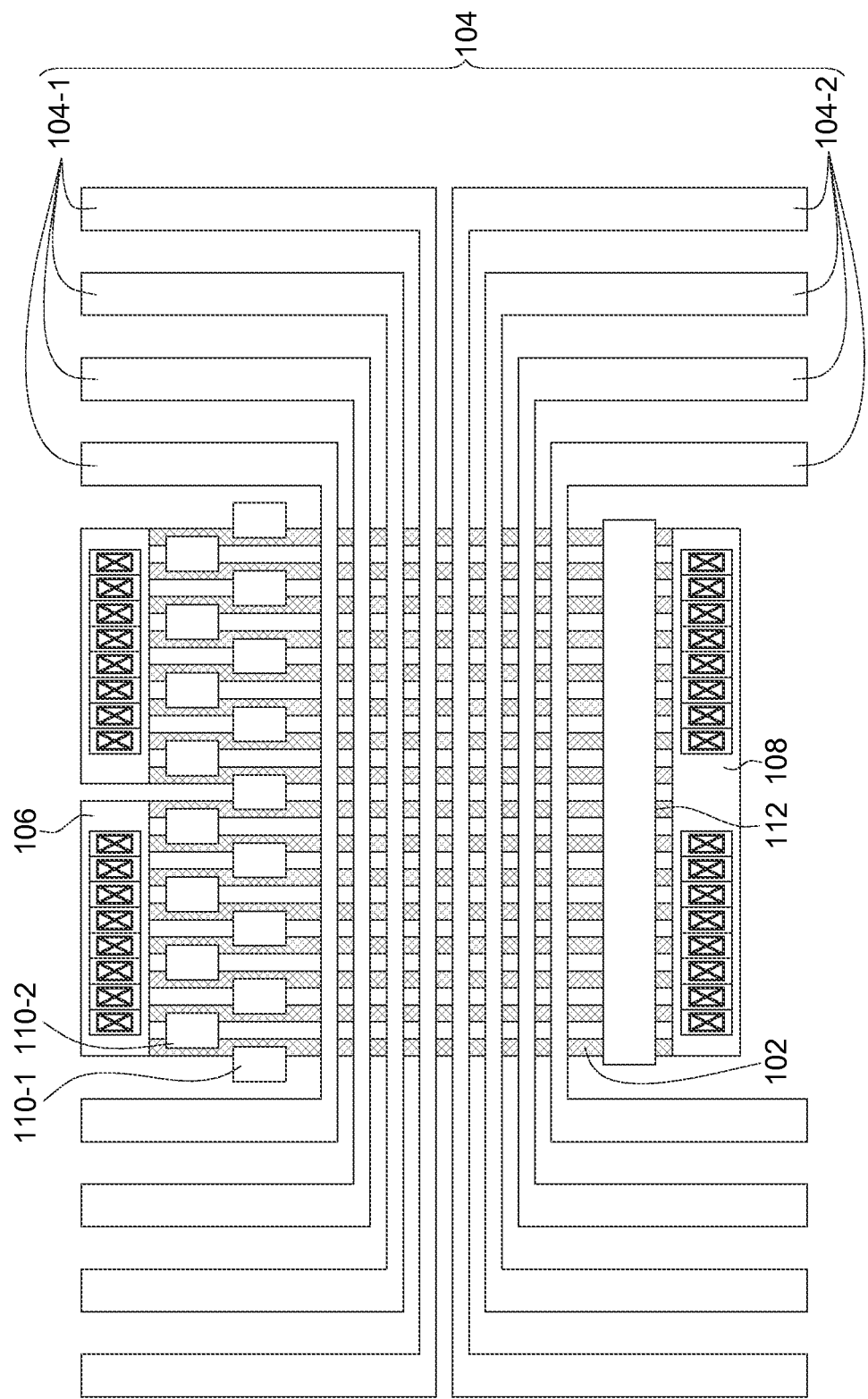
FIG. 1 to FIG. 4 illustrate a method for manufacturing a 3D memory structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to a method for manufacturing a 3D memory structure according to embodiments. Referring to FIG. 1, a plurality of strings 102 are formed. The strings 102 are disposed in parallel. Then, a plurality of first conductive lines 104 are formed over the strings 102. Center regions of the first conductive lines 104 are formed perpendicular to the strings 102. Half of the first conductive lines 104-1 and the other half of the first conductive lines 104-2 may have U-shapes toward opposite directions. In one embodiment, the first conductive lines 104 are word lines.

Bit line pads 106 and a source pad 108 may be formed terminating the strings 102 at opposite ends of the strings 102. String select switches 110-1 and 110-2 may be formed connecting the strings 102 near the bit line pads 106. In one embodiment, the strings 102 are controlled by the AND-type string select switches 110-1 and 110-2. That is, a string 102 will be controlled by a pair of string select switches 110-1 and 110-2. Only when both of the string select switch 110-1 and the string select switch 110-2 are turned-on, the string 102 controlled by them will be selected. A ground select line 112 may be formed across the strings 102 near the source pad 108.

Figure 2:
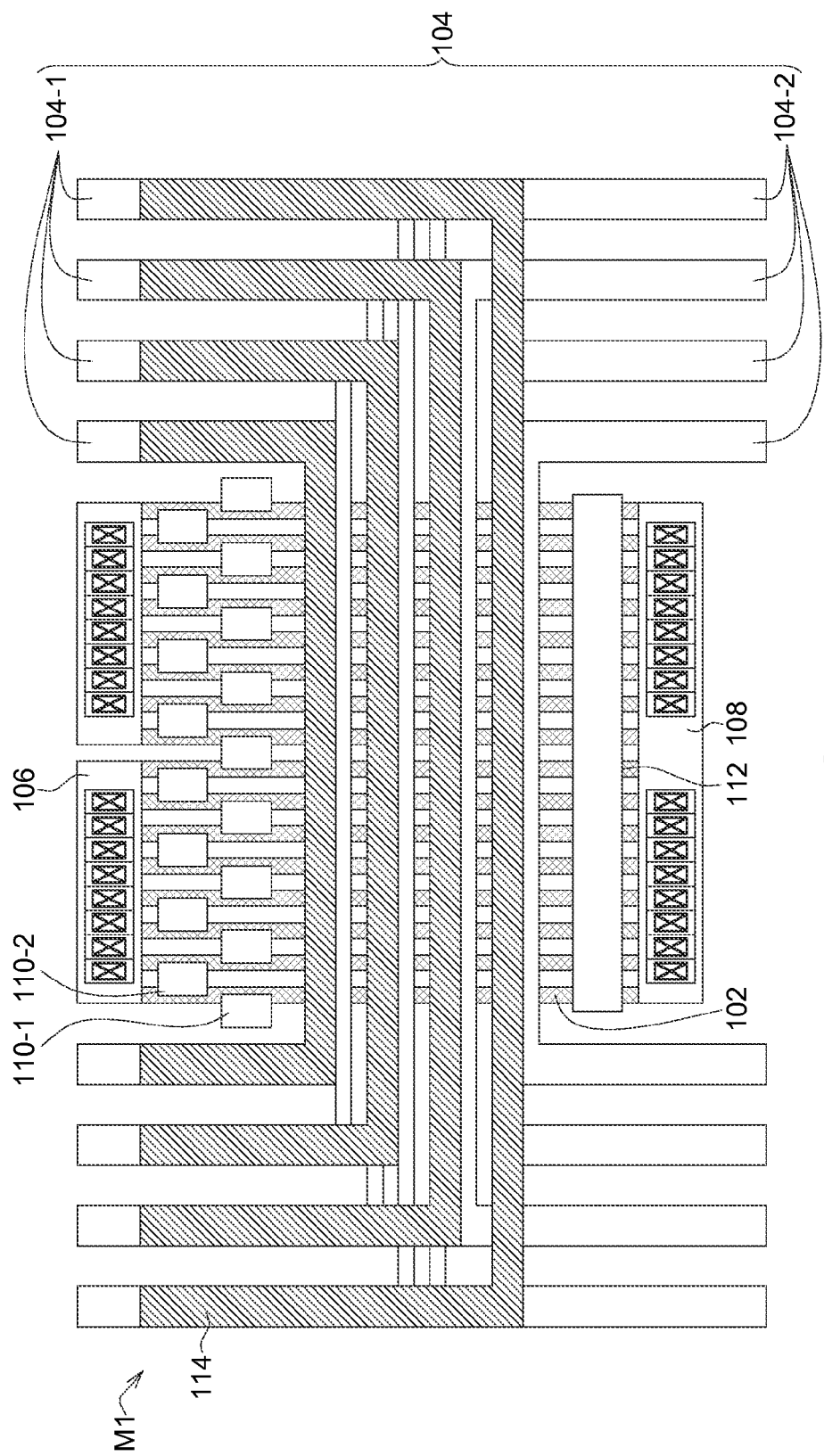

Referring to FIG. 2, a plurality of second conductive lines 114 are formed over the first conductive lines 104. The second conductive lines 114 connect end regions of half of the first conductive lines 104-1. The second conductive lines 114 may be formed by a metal. More specifically, the second conductive lines 114 may be formed by a first metal layer M1.

Figure 3:
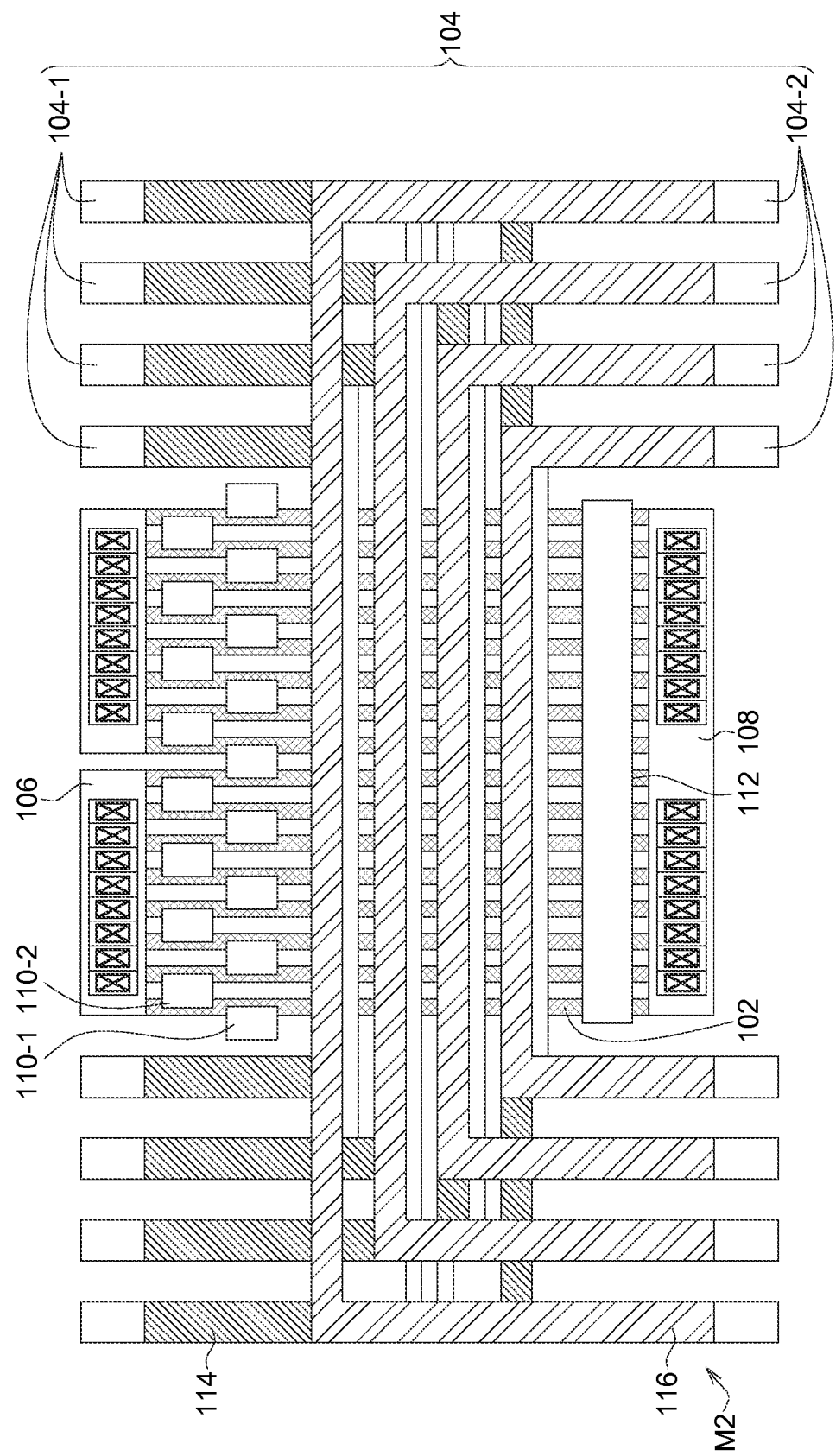

Referring to FIG. 3, a plurality of third conductive lines 116 are formed over the second conductive lines 114. The third conductive lines 116 connect end regions of the other half of the first conductive lines 104-2. The third conductive lines 116 may be formed by a metal. More specifically, the third conductive lines 116 may be formed by a second metal layer M2. The second conductive lines 114 and the third conductive lines 116 may have U-shapes toward opposite directions. The second conductive lines 114 and the third conductive lines 116 may have the U-shapes corresponding to the half of the first conductive lines 104-1 and the other half of the first conductive lines 104-2, respectively.

Figure 4:
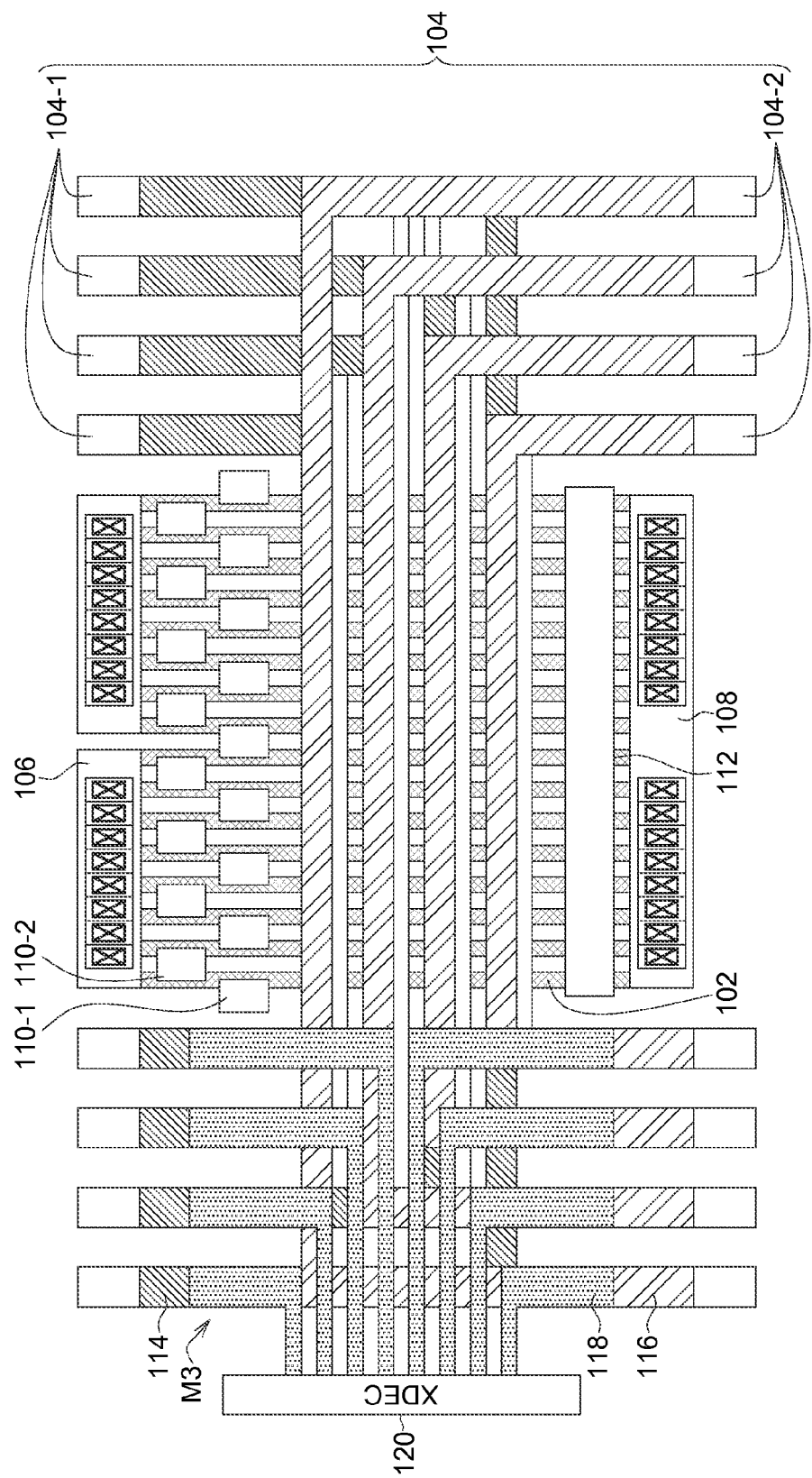

Referring to FIG. 4, a plurality of fourth conductive lines 118 are formed connecting the second and third conductive lines 114 and 116 to a X-decoder 120. The fourth conductive lines 118 may be formed by a metal. More specifically, the fourth conductive lines 118 may be formed by a third metal layer M3, and may be formed over or under the second and third conductive lines 114 and 116. In one embodiment, the third metal layer M3 further comprises fifth conductive lines (not shown) in the array region for bit line connection.

In the method described above, the first conductive lines 104 are connected to the X-decoder 120 by the second, third and fourth conductive lines 114, 116 and 118 formed by the first, second and third metal layers M1, M2 and M3, respectively. The process is compatible to the typical 3D memory manufacturing process, and no additional step is needed. Since the second, third and fourth conductive lines 114, 116 and 118 are formed by a back-end-of-line process, there is no need to change the array design. Further, the second, third and fourth conductive lines 114, 116 and 118 do not need to be formed by a tight pitch process. This is beneficial for the conduct of the manufacturing process.

A 3D memory structure manufactured by the method described above may be, for example, a 3D NAND flash memory structure. The 3D memory structure comprises a plurality of strings 102, a plurality of first conductive lines 104, a plurality of second conductive lines 114 and a plurality of third conductive lines 116. The strings 102 are disposed in parallel. The first conductive lines 104 are disposed over the strings 102. Center regions of the first conductive lines 104 are disposed perpendicular to the strings 102. The first conductive lines 104 may be word lines. The second conductive lines 114 are disposed over the first conductive lines 104. The second conductive lines 114 connect end regions of half of the first conductive lines 104-1. The third conductive lines 116 are disposed over the second conductive lines 114. The third conductive lines 116 connect end regions of the other half of the first conductive lines 104-2. The second conductive lines 114 and the third conductive lines 116 may have U-shapes toward opposite directions. Half of the first conductive lines 104-1 and the other half of the first conductive lines 104-2 may have U-shapes corresponding to the second and third conductive lines 114 and 116, respectively. The 3D memory structure may further comprise a plurality of fourth conductive lines 118 connecting the second and third conductive lines 114 and 116 to a X-decoder 120. The fourth conductive lines 118 may be disposed over the second and third conductive lines 114 and 116. The second, third and fourth conductive lines 114, 116 and 118 may be formed by metals. The second, third and fourth conductive lines 114, 116 and 118 may each be formed by metal layers M1, M2 and M3.

From another point of view, a 3D memory structure manufactured by the method described above comprises a plurality of strings 102, a plurality of first conductive lines 104, a first metal layer M1 and a second metal layer M2. The strings 102 are disposed in parallel. The first conductive lines 104 are disposed over the strings 102. Center regions of the first conductive lines 104 are disposed perpendicular to the strings 102. The first conductive lines 104 may be word lines. The first metal layer M1 is disposed over the first conductive lines 104. The first metal layer M1 comprises a plurality of second conductive lines 114 connecting end regions of half of the first conductive lines 104-1. The second metal layer M2 is disposed over the first metal layer M1. The second metal layer M2 comprises a plurality of third conductive lines 116 connecting end regions of the other half of the first conductive lines 104-2. The 3D memory structure may further comprise a third metal layer M3 disposed over the second metal layer M2. The third metal layer M3 comprises a plurality of fourth conductive lines 118 connecting the second and third conductive lines 114 and 116 to a X-decoder 120.

Figure 5:
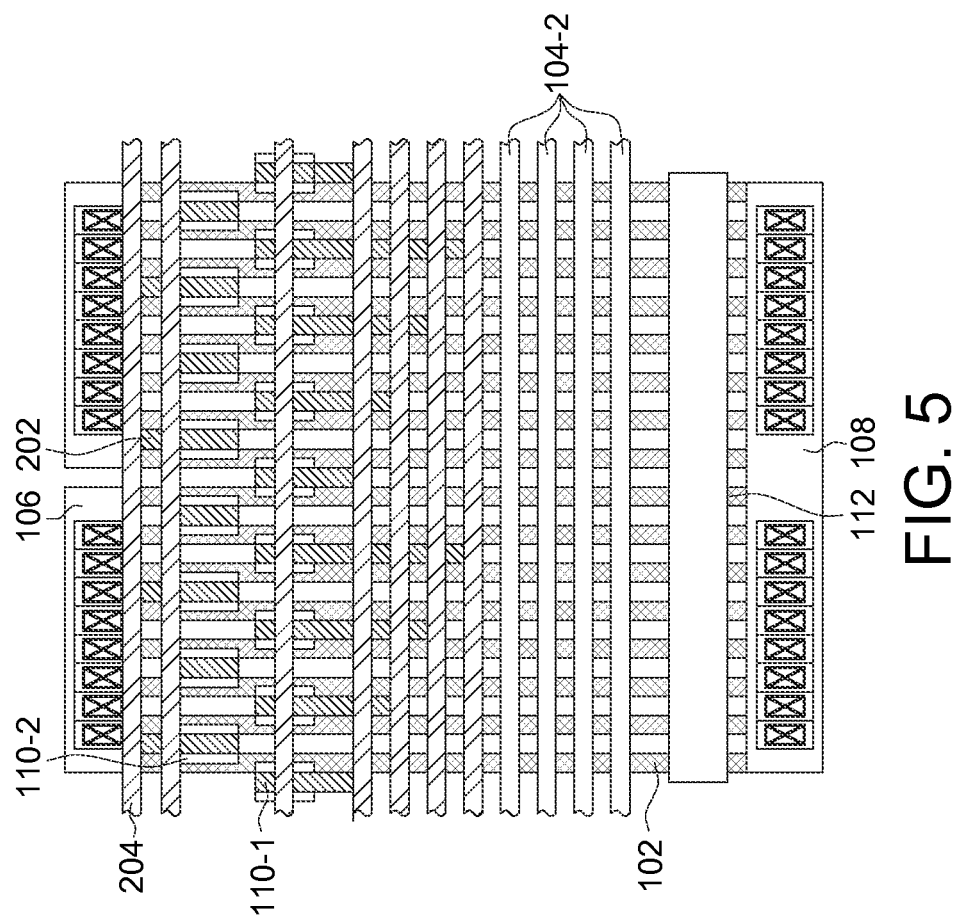
FIG. 5 illustrates a 3D memory structure according to one embodiment.

In one embodiment, routings for string select switches 110-1 and 110-2 may be disposed as shown in FIG. 5. Conductors 202 and 204 are used to connect and provide the on/off signals to the string select switches 110-1 and 110-2. The conductors 202 may be formed by the first metal layer M1 while the conductors 204 may be formed by the second metal layer M2, or vice versa. The selection of strings 102 is conducted by the cooperation of two sets of the string select switches 110-1 and 110-2. By such design, the number of conductors 202 and 204 can be decreased, and thereby the first and second metal layers M1 and M2 can be used to form the second and third conductive lines 114 and 116.

According to this disclosure, the first conductive lines (for example, word lines) may be connected to the X-decoder by high-conductivity lines, such as metal lines. As such, one X-decoder is enough for the control of an array region. Thus, the space needed for the X-decoder is decreased, and the size of the 3D memory device can be further shrunk.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A 3D memory structure, comprising:
   a plurality of strings disposed in parallel;
   a plurality of first conductive lines disposed over the strings, wherein each of the first conductive lines has a center region disposed perpendicular to the strings and has two end regions electrically connected to opposite sides of the center region;
   a plurality of second conductive lines disposed over the first conductive lines, wherein each of the second conductive lines electrically connects between the two end regions of half of the first conductive lines; and
   a plurality of third conductive lines disposed over the second conductive lines, wherein each of the third conductive lines electrically connects between the two end regions of the other half of the first conductive lines.

2. The 3D memory structure according to claim 1, wherein the second conductive lines and the third conductive lines have U-shapes toward opposite directions.

3. The 3D memory structure according to claim 2, wherein the half and the other half of the first conductive lines have U-shapes corresponding to the second and third conductive lines, respectively.

4. The 3D memory structure according to claim 1, further comprising:
   a plurality of fourth conductive lines connecting the second and third conductive lines to a X-decoder.

5. The 3D memory structure according to claim 4, wherein the fourth conductive lines are disposed over the second and third conductive lines.

6. The 3D memory structure according to claim 4, wherein the second, third and fourth conductive lines are formed by metals.

7. The 3D memory structure according to claim 4, wherein the second, third and fourth conductive lines are each formed by metal layers.

8. The 3D memory structure according to claim 1, wherein the first conductive lines are word lines.

9. A 3D memory structure, comprising:

a plurality of strings disposed in parallel;

a plurality of first conductive lines disposed over the strings, wherein each of the first conductive lines has a center region disposed perpendicular to the strings and has two end regions electrically connected to opposite sides of the center region;

a first metal layer disposed over the first conductive lines, the first metal layer comprising a plurality of second conductive lines, wherein each of the second conductive lines electrically connects two end regions of half of the first conductive lines; and a second metal layer disposed over the first metal layer, the second metal layer comprising a plurality of third conductive lines, wherein each of the third conductive lines electrically connects two end regions of the other half of the first conductive lines.

10. The 3D memory structure according to claim 9, wherein the second conductive lines and the third conductive lines have U-shapes toward opposite directions.

11. The 3D memory structure according to claim 10, wherein the half and the other half of the first conductive lines have U-shapes corresponding to the second and third conductive lines, respectively.

12. The 3D memory structure according to claim 9, further comprising:

a third metal layer disposed over the second metal layer, the third metal layer comprising a plurality of fourth conductive lines connecting the second and third conductive lines to a X-decoder.

13. The 3D memory structure according to claim 9, wherein the first conductive lines are word lines.

* * * * *